United States Patent
Wyland

(10) Patent No.: US 7,217,997 B2
(45) Date of Patent: May 15, 2007

(54) GROUND ARCH FOR WIREBOND BALL GRID ARRAYS

(75) Inventor: Chris Wyland, Livermore, CA (US)

(73) Assignee: NXP BV., Eindhoven (NL)

( * ) Notice: Subject to any disclaimer, the term of this patent is extended or adjusted under 35 U.S.C. 154(b) by 0 days.

(21) Appl. No.: 10/565,044

(22) PCT Filed: Jul. 30, 2004

(86) PCT No.: PCT/IB2004/051351

§ 371 (c)(1),
(2), (4) Date: Jan. 18, 2006

(87) PCT Pub. No.: WO2005/010989

PCT Pub. Date: Feb. 3, 2005

(65) Prior Publication Data

US 2006/0180916 A1    Aug. 17, 2006

Related U.S. Application Data

(60) Provisional application No. 60/491,338, filed on Jul. 30, 2003.

(51) Int. Cl.
*H01L 23/34* (2006.01)
(52) U.S. Cl. .................. 257/707; 257/690; 257/706; 257/773; 257/E23.08; 257/E23.101; 438/122; 438/125
(58) Field of Classification Search .................. 257/707
See application file for complete search history.

(56) References Cited

U.S. PATENT DOCUMENTS

| | | | |
|---|---|---|---|
| 5,083,772 A | | 1/1992 | Brown |
| 5,166,722 A | | 11/1992 | Kusaka |
| 5,851,337 A | * | 12/1998 | Chen ........................ 156/275.3 |
| 5,872,403 A | | 2/1999 | Bowman et al. |
| 5,977,626 A | | 11/1999 | Wang |
| 6,054,759 A | * | 4/2000 | Nakamura ................... 257/691 |
| 6,229,702 B1 | | 5/2001 | Tao et al. |
| 6,319,775 B1 | | 11/2001 | Halliyal et al. |
| 6,373,127 B1 | * | 4/2002 | Baudouin et al. ............ 257/676 |
| 6,703,698 B2 | * | 3/2004 | Huang et al. ................ 257/678 |
| 6,713,863 B2 | * | 3/2004 | Murayama et al. ......... 257/707 |
| 6,737,750 B1 | * | 5/2004 | Hoffman et al. ............. 257/777 |
| 2003/0089983 A1 | | 5/2003 | Huang et al. |
| 2003/0116836 A1 | * | 6/2003 | Huang et al. ................ 257/678 |

FOREIGN PATENT DOCUMENTS

| EP | 0 435 530 | 7/1991 |
|---|---|---|
| EP | 1 347 513 | 9/2003 |

* cited by examiner

*Primary Examiner*—Minhloan Tran
*Assistant Examiner*—Eduardo A. Rodela
(74) *Attorney, Agent, or Firm*—Peter Zawilski

(57) ABSTRACT

A structure provides for the control of bond wire impedance. In an example embodiment, there is an integrated circuit device comprising a semiconductor device die having a plurality of grounding pads, signal pads, and power pads and a package for mounting the integrated circuit and includes a conductive path having at least one reference trace that surrounds the integrated circuit. A grounding arch is disposed over the semiconductor device die.

4 Claims, 6 Drawing Sheets

GROUND ARCH FOR WIREBOND BALL GRID ARRAYS

CROSS REFERENCE TO RELATED APPLICATION

This application claims the benefit of U.S. provisional application Ser. No. 60/491,338 filed Jul. 30, 2003, which is incorporated herein whole by reference.

The invention relates to the field of integrated circuit packaging, and particularly to reducing the bond wire impedance in high pin count semiconductor packages.

As integrated circuit technology improves to increase the density and complexity of devices that may be rendered in a given area of substrate, a significant challenge is posed to the packaging of these devices. In computer applications, for example, the width of the data bus has increased from 16, 32, 64, to 128 bits and beyond. During the movement of data in a system it is not uncommon for a bus to have simultaneously switching outputs (SSOs). The SSOs often result in the power and ground rails of the chip experiencing noise owing to the large transient currents present during the SSOs. If the noise is severe, the ground and power rails shift from their prescribed voltage causing unpredictable behavior in the chip.

In a BGA (Ball Grid Array) package, bond wires are often used to connect the device die to the ground on the package. In high pin count BGAs, a ground ring is commonly used. These bond wires are sometimes placed in close proximity to signal bond wires to control the impedance of signal bond wires by creating a coplanar waveguide structure.

U.S. Pat. Nos. 5,872,403 and 6,083,772 are directed to a structure and method of mounting a power semiconductor die on a substrate. They are directed in general, to power electronics and more specifically, to a low impedance heavy current conductor for a power device and method of manufacture therefor.

U.S. Pat. No. 6,319,775 B1 relates to a method of making an integrated circuit package, and in particular to a process for attaching a conductive strap to an integrated circuit die and a lead frame. This patent and the previous two cited are incorporated by reference in their entirety.

In a conventional process, metal tent-like structures, often referred to as drop-in heat sinks, may be used to reduce thermal resistance. These drop-in heat sinks may or may not be grounded. However, the distance from the drop-in heat sink to the bond wires may be too far to have a significant effect on the bond wires' impedances. Consequently, there is very little control over the bond wire impedance. There exists a need for providing control of bond wire impedance, especially in high frequency, high-performance applications.

In an example embodiment, structure provides for the control of bond wire impedance. There is an integrated circuit device comprising a semiconductor device die having a plurality of grounding pads, signal pads, and power pads and a package for mounting the integrated circuit. The package includes a conductive path having at least one reference trace grounding trace that surrounds the integrated circuit. A grounding arch is disposed over the integrated circuit. A feature of this embodiment, is that the reference trace is coupled to at least one of the following: a voltage reference and a ground reference. Another feature of this embodiment is that the grounding arch comprises a metal tape laminated with a dielectric material.

In another embodiment, a method for controlling the impedance of bond wires in packaging a semiconductor device die is discussed. The method comprises defining locations of signal and power/ground pads on the device die. Grounding trace locations on the package are defined. Having defined the grounding trace locations, the signal pads and power/ground pads of the device die are wire bonded. A conductive path including a ground arch is disposed over the bond wires and the grounding trace locations. The ground arch is attached to the package coupling the ground arch to the grounding trace locations. The device die and ground arch are encapsulated.

Additional advantages and novel features will be set forth in the description which follows, and in part may become apparent to those skilled in the art upon examination of the following, or may be learned by practice of the invention.

The invention is explained in further detail, by way of examples, and with reference to the accompanying drawings wherein.

The present invention is advantageous in reducing the impedance of the paths connecting the power or ground of the device and the BGA package. Furthermore, the present invention can control the impedance of the signal bond wires by placing a ground arch at a predetermined distance from the signal bond wires.

The present invention is advantageous in reducing the impedance of the paths connecting the power or ground of a device and a BGA package. Furthermore, the present invention can control the impedance of the signal bond wires by placing a ground arch at a predetermined distance from the signal bond wires. This is helpful in high-frequency applications, for example high frequency memory applications near 1 GHz. Also, there are high-speed applications in which the rise time of the signal is faster than the propagation delay through the package. By having a lower bond wire impedance, a faster rise time is possible at the die pad since the rise time at the pad is defined by the package interconnect characteristic impedance multiplied by the pad capacitance. A reduced package interconnect impedance, including bond wires, enables a faster rise time and thus a faster IC device.

In other applications, the ground arch may be bonded to a stable reference voltage other than ground. Such an application, may be driven by particular device die characteristics and voltage supply requirements.

Figure 1:
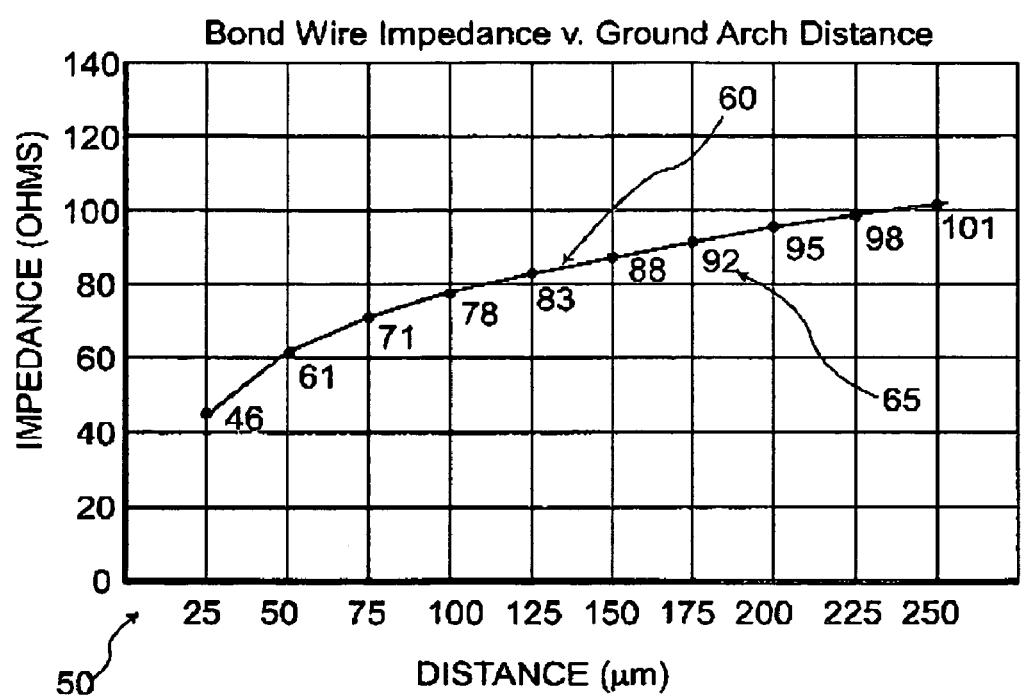
FIG. 1 is a plot of Bond Wire Impedance v. Ground Arch Distance.

As shown in FIG. 1, the plot 50 depicts the bond wire impedance as a function of the bond wire's distance from the ground arch. Curve 60 depicts the impedance of the wire bond at varying distances. The impedance at the various distances is shown by the numbers indicated 65 at each data point in the curve. For example, at a distance of 50 µm, the impedance of the wire is about 61 ohms. In another example, not illustrated, at a distance of about 500 µm the impedance is about 119 ohms. For an unshielded bond wire, the impedances is about 125 Ohms.

In an example embodiment, a strip of copper is formed closely over the semiconductor device die and bond wires to reduce the bond wire impedance. In addition, the reduced bond wire impedance reduces bond wire inductance and electromagnetic interference (EMI). The use of a thin copper tape makes is possible to customize the grounding arch to a particular bond wire and die configuration.

Figure 2A:
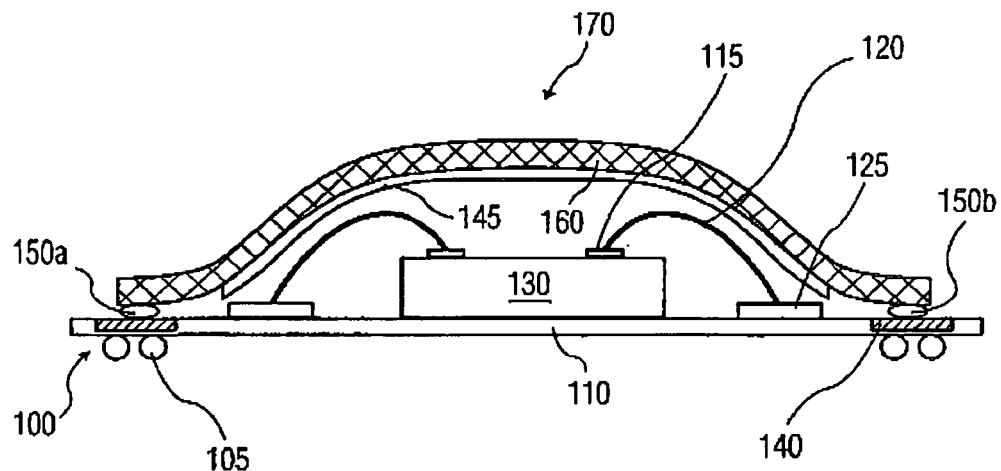
FIG. 2A is a side-view of a ground arch structure for a BGA according to an embodiment of the present invention.

Referring now to FIG. 2A, in an example embodiment according to the present invention, a low impedance power or ground connection being made between a die and package in close proximity to wire bonds. This lessens the wire bonds' impedance. An IC device has been packaged in a BGA package structure 100. Die 130 has been attached to substrate 110. Die pads 115 have been wire bonded with wires 120 to package landings 125. Solder balls 105 are coupled to a ground trace 140. This ground trace 140 may be a grounding ring often used in a BGA to provide connection to ground for the IC die 130. Ground arch 170 is disposed over the bonded IC die 130 and is attached to ground trace 140 via a conductive bonds 150a and 150b. The ground arch 170 has a conductive material 160 and a dielectric material 145. The conductive material 160 may comprise any metal compatible with processes used to fabricate the semiconductor device die and process used to package that device die. Such material may include, but is not limited to, copper, gold, silver, aluminum and alloys thereof.

Figure 2B:
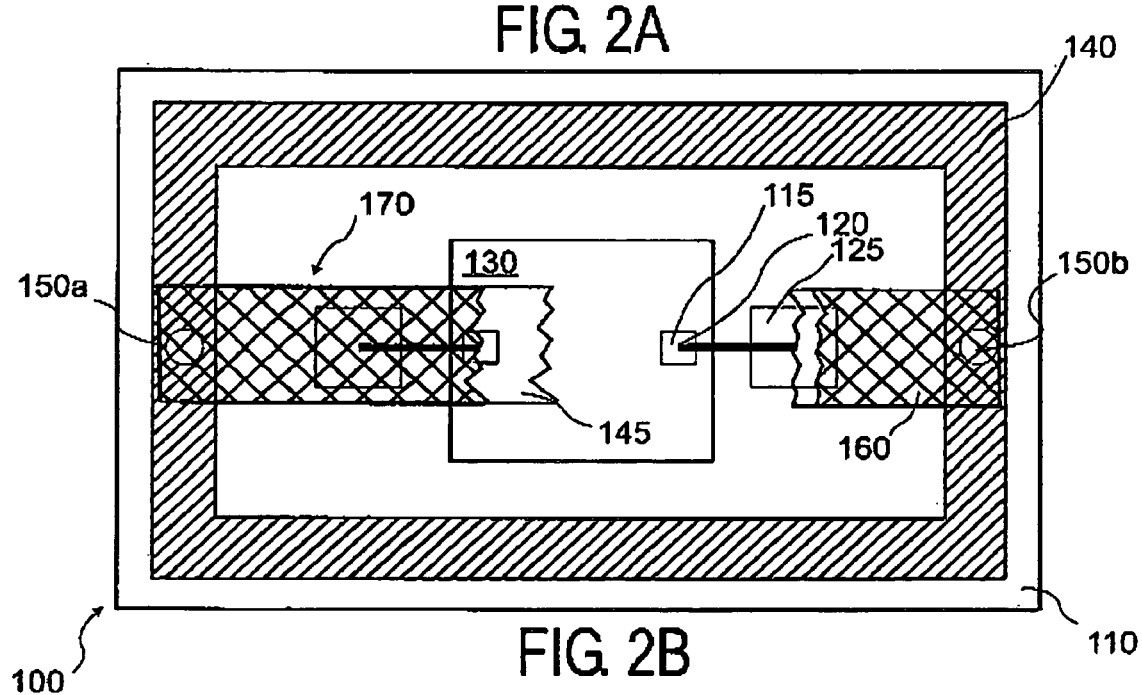
FIG. 2B is a top view of the ground arch structure depicted in FIG. 2A.
Figure 2C:
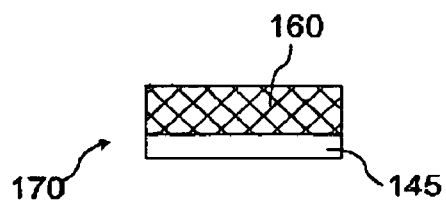
FIG. 2C is a detail of the ground arch structure depicted in FIGS. 2A and 2B.

Referring now to FIG. 2B, the structure of FIG. 2A shows the relationship of the ground arch 170 with respect to the ground trace 140. In this example, the ground trace 140 is a grounding ring surrounding the semiconductor device die.

FIG. 2B is a close-up cross-sectional view of the ground arch 170. The conductive material 160 and dielectric material 145 are at thicknesses compatible with a particular package type. For example, the present invention may be applied to ceramic and plastic pin grid arrays (PGAs) with a specially designed lead frame. The lead frame is designed so the ground leads are wide enough to allow electrical contact with the arch.

In an example embodiment, the conductive material 160 may be a copper tape. Copper tape is conveniently formed and may be efficiently customized for a given die size and wire bond height and length. However, the tape has to be of sufficient thickness to provide a self-supporting structure that can withstand the rigors of encapsulation. For example, a thickness of 25 µm may be sufficient or, under other circumstances one may use a thickness of 250 µm. The thickness, depends upon the extent of the package and what can be manufactured. The conductive bonds 150a and 150b may be a conductive adhesive, solder, or compression bond but is not necessarily limited to these methods of providing electrical attachment.

Figure 2D:
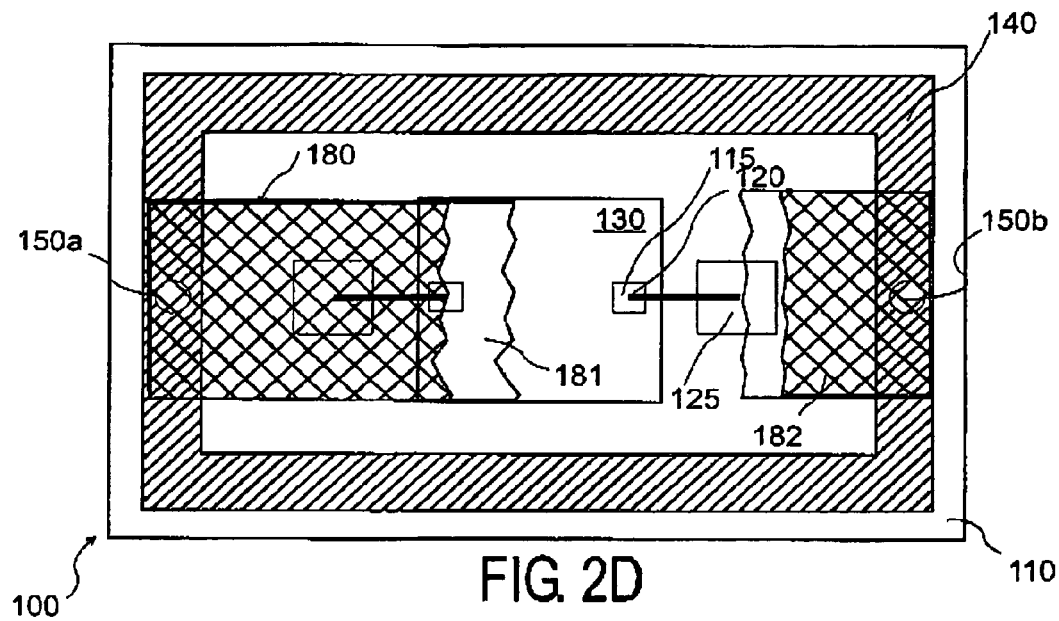
FIG. 2D is a ground arch structure according to another embodiment of the present invention.

The dielectric material 145 prevents the conductive material 160 from touching the bond wires 120, causing short circuits. There are a large number of dielectrics which can be applied to the arch to prevent accidental shorting. The type of dielectric chosen is selected on the basis of minimizing the dielectric constant in line with potential costs. Such dielectric material 145 may include, but not limited to, thermoplastic, epoxy, polyimide, polyamide, soldermask, polytetrafluoroethylene (PTFET), often known by the brand TEFLON of E.I. du Pont de Nermours and Company. The dielectric, of course, has to withstand the temperatures encountered during the molding process. Referring to FIG. 2D, in another example embodiment the ground arch structure of 2A may be modified by using a ground 180 having dimensions comparable to those of the device die 130. The ground arch 180 has a metal layer 182 bonded to a dielectric layer 181 to prevent electrical contact with the bond wire 120.

Figure 2E:
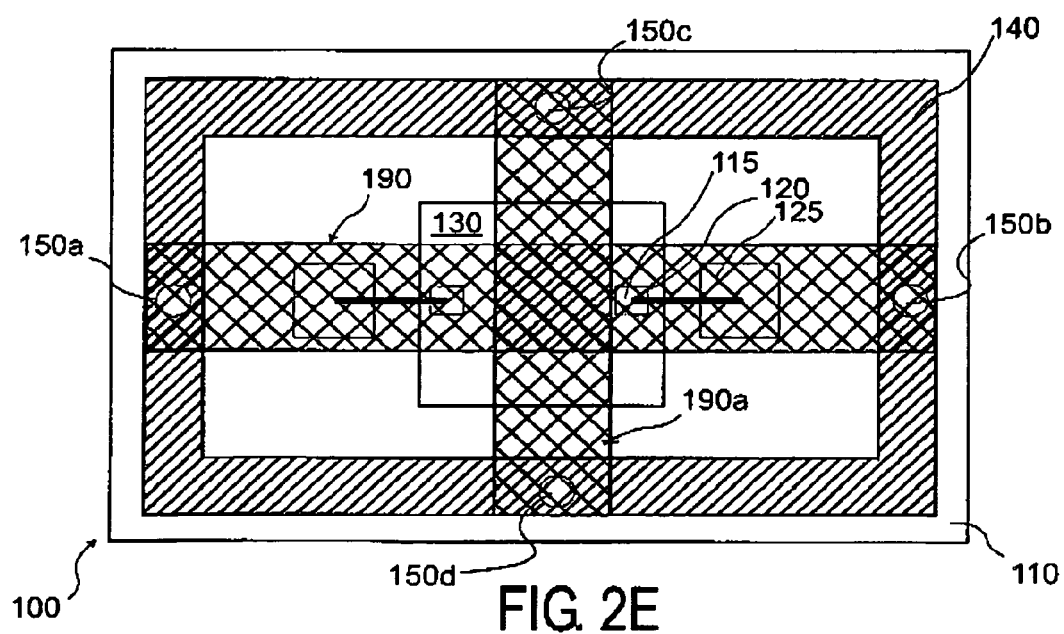
FIG. 2E is a ground arch structure according to another embodiment of the present invention.

Referring to FIG. 2E in another example embodiment the around arch structure of 2A, may be modified to have more than one ground arch. The first ground arch 190a is counted to the ground ring 140 at conductive bonds 150a and 150; a second ground arch 190b is coupled to the ground ring a conductive bonds 150c and 150d.

Figure 3:
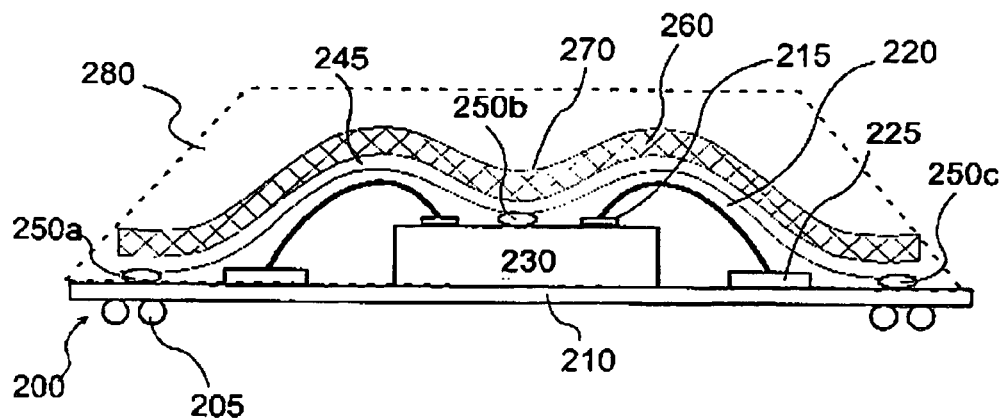
FIG. 3 is a side-view of another ground arch structure for a BGA, according to another embodiment of the present invention.

Referring now to FIG. 3, there may be applications in which a conductive bond to ground is not desirable. In another embodiment according to the present invention, a structure 200 has a die 230 bonded to a substrate 210. The die 230 has been wire bonded with wires 220 from pad landings 215 to package landings 225. Arch 270 having a conductive portion 260 upon which an insulating material 245 is disposed thereon, is bonded to the substrate 210 via bonds 250a, 250b, 250c. The arch 270 bends at its center, providing an additional bonding point. In this instance, the arch is bonded on its insulating material 245. Bonds 250a and 250c are not connected to solder balls 205 through a ground trace, therefore the arch is not electrically grounded, and it is possible to attach it about the center of the die having active circuits. However, the conductive material in the arch provides a path to dissipate heat generated by the semiconductor device die 230. The device design and packaging process dictates the desirability of the non-electrically connected bonding. The bonds 250a, 250b, and 250c are glued with an adhesive suitable to provide a sufficient mechanical connection of the arch. The dielectric material chosen may be selected to have desirable heat transfer characteristics and compatibility with the adhesive used. To protect the integrated circuit device contents, the package is sealed in a suitable encapsulation 280, shown by the dashed line in the drawing.

Figure 4:
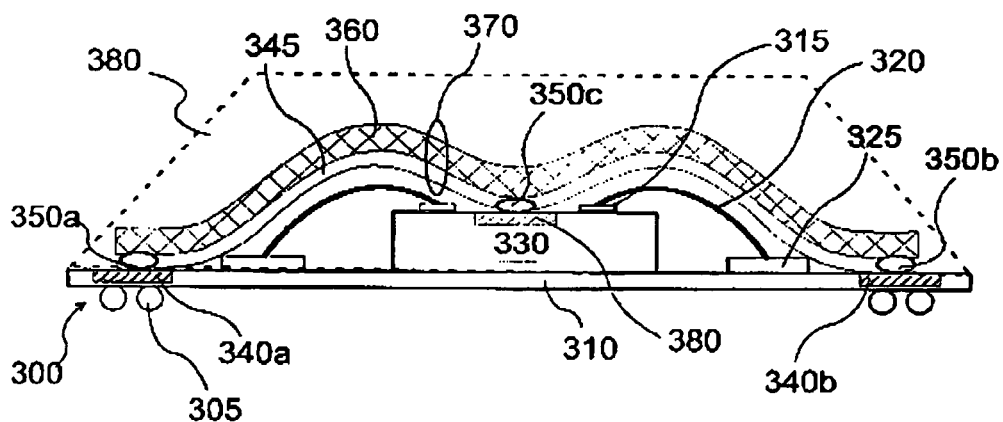
FIG. 4 is a side view of yet another ground arch structure for a BGA, according to another embodiment of the present invention.

Referring to FIG. 4, in another embodiment of the present invention, the style of arch, as depicted in FIG. 3, may be electrically bonded to the package. An integrated circuit device includes a structure 300 has a semiconductor device die 330 attached to substrate 310. Wire bonds 320 couple die pad landings 315 to package landings 325. On the underside of package substrate 310, solder balls 305 are coupled to package substrate 310 ground traces 340a and 340b. Upon these ground traces 340a and 340b, the ground arch 370 is coupled thereon via conductive bonds 350a and 350b at points in which the dielectric material 245 of the ground arch 370 has been opened to expose the ground arch's conductive material 260. In a particular example embodiment, these conductive bonds 350a and 350b may be solder balls. However these conductive bonds 350a and 350b may also include conductive epoxy. gold compression bonds, ultrasonic welds. etc. In addition to the conductive bonds 350a and 350b, the die 330 has a grounding region 380 about the center, upon which an additional conductive bond 350c may be attached. To attain this configuration, the user would plan the layout of his or her IC design so that a grounding region 380 may be built about the center of the semiconductor device die 330. This ground would be incorporated into the design of a particular IC device early in the design process. If the design does not permit a centered grounding region the grounding regions may be placed, for example, in different quadrants of the semiconductor device die. To protect the integrated circuit device contents, the package is sealed in a suitable encapsulation 390, shown by the dashed line in the drawing.

In another embodiment, the style of ground arch 370 may be bonded electrically to the ground traces 340a and 340b at 350a and 350b. The electrical connection at 350c is omitted because there would be no center ground trace 380. The arch 370 at 350c may be adhered about the die center but not electrically coupled. Thus, the ground arch 370 provides additional grounding at 340a, 350a and 340b, 350b, and heat dissipation at 350c.

The lowered inductance of the ground arch improves the signal integrity by reducing the induced noise on the power or ground due to I/O switching current. The tape used in building the ground arch may be solid or a mesh. In situations where the arch is not coupled to ground, an improvement in thermal performance of the package may be realized in that the arch provides a low thermal resistance, dissipating die generated heat. In grounded applications, the arch reduces EMI by providing a shield above the die. Combined with the package, the die is surrounded by a ground shield.

Figure 5:
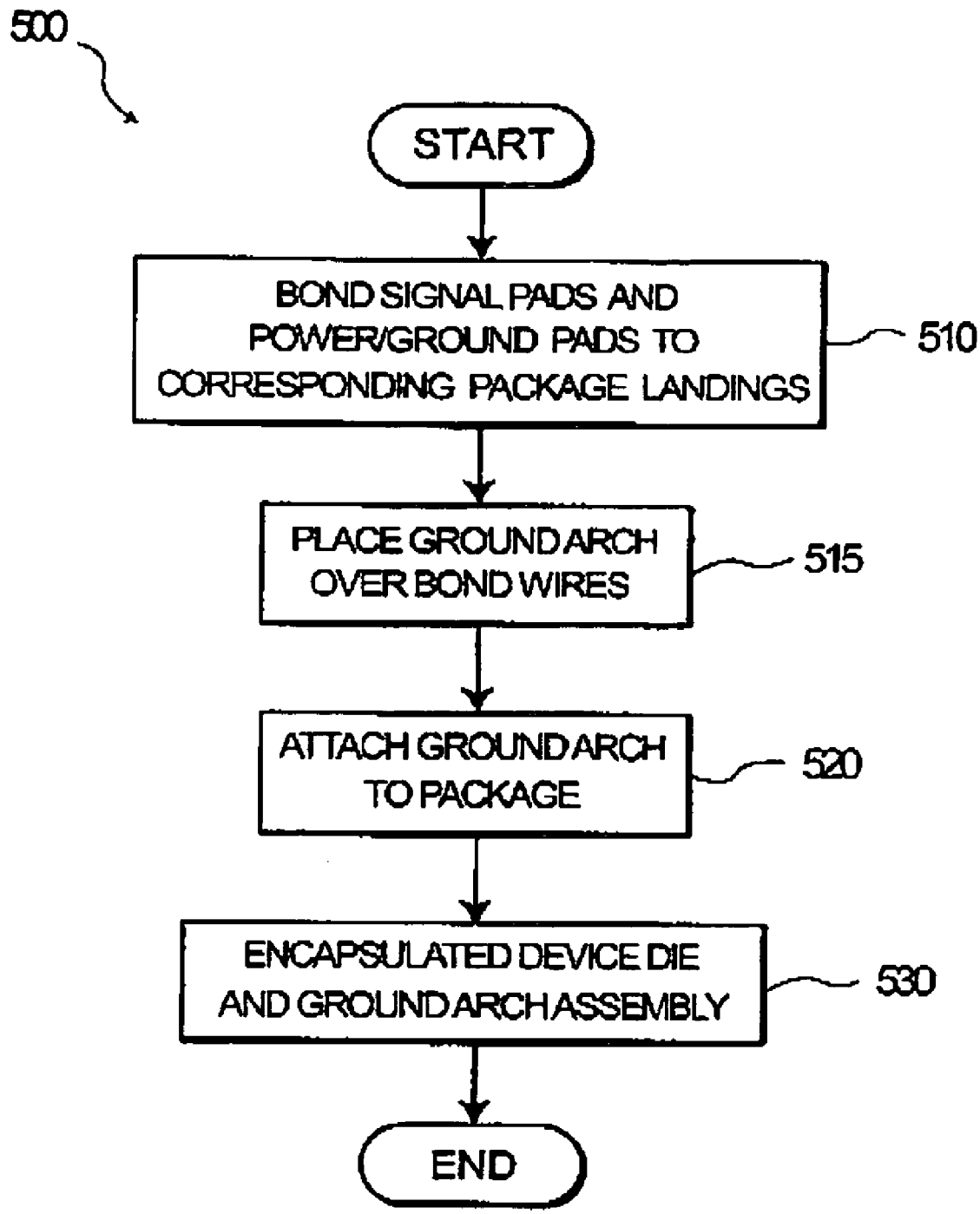
FIG. 5 is a flow chart of packaging a device die in accordance with an example embodiment of the present invention.

FIG. 5 shows a flow chart where the above embodiments may be applied to a given device die having a high pin count and being packaged in a correspondingly high ball/pin count package.

In an example embodiment, a series of steps 500 may be followed to implement the present invention on a device die and package. The designer will have already defined the location of the signal and power/ground pads on the device. Up front design work would focus on minimizing the incidence of noise on the device while increasing the performance of the device. Having selected a suitable package, user bonds the device's signal and power/ground pads to corresponding package landings 510. After completing the bonding 510, the ground arch is placed over the bond wires 515. The dielectric material present in the ground arch lessens the likelihood of forming short circuits. The ground arch is attached to the package 520 with conductive bonds. Having attached the ground arch, the user encapsulates the device die and ground arch assembly 530. As mentioned earlier, the ground arch may be formed to have a depression about the center (FIGS. 3 and 4) so that a thermally conductive adhesive may be used to attach the ground arch about the center of the die.

A number of methods may be employed to make electrical contact, between the arch and the ground. For example, one may use a conductive glue between the copper of the arch and the package ground. One such conductive die attach material is the ABELSTIK 2000B™ brand of conductive glue of National Starch Company.

In another example embodiment, the arch may be soldered to the package. In this case, a solder paste is applied to the package ground connection and the arch contacts the solder paste. The solder paste is re-flowed making a connection. A solder paste with a re-flow temperature above the mold compound curing temperature is often used.

In another example embodiment, the attachment mechanism may be a gold thermo-compression bond where the ground pad and the arch are gold plated and then connected via heat and pressure making a thermo-compression bond. Other methods may be those used to attach silicon die to a package or to wire bond the die pads to package landings.

Figure 6:
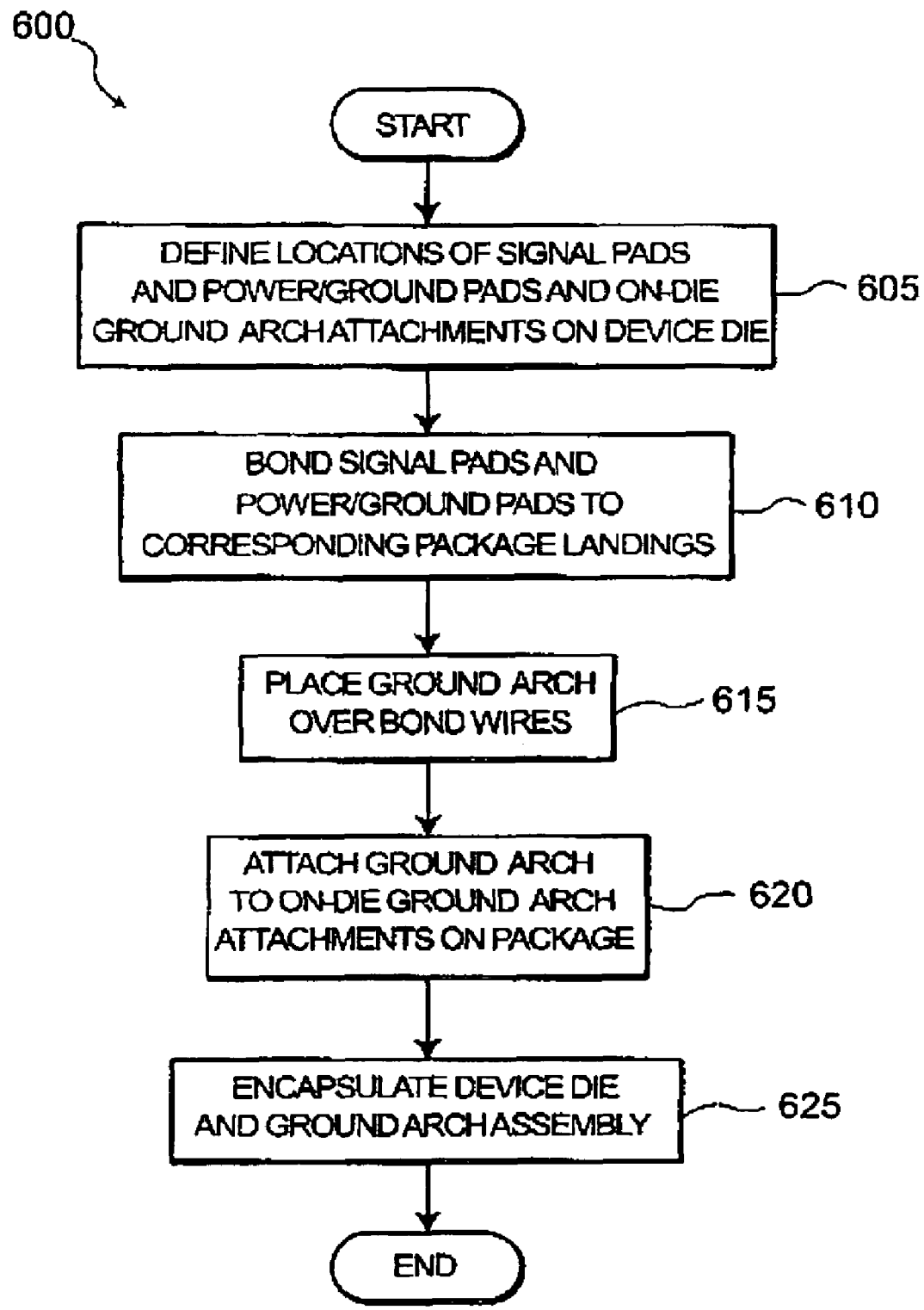
FIG. 6 is flow chart that exemplifies one approach for packaging a device, in accordance with another example embodiment of the present invention.

The flow chart of FIG. 6 illustrates one approach for manufacturing semiconductor devices implemented consistent with the above embodiments. In another example embodiment, the designer in anticipation of requiring additional grounding and heat dissipation defines locations of signal pads, power/ground pads and on-die ground arch attachments on the device die 605. Step 605 usually occurs before any actual design is rendered in silicon. However, the present invention may be applied to any device and package combination. Having defined the device die pad layout and package, the device's signal and power/ground pads are bonded to the corresponding package landings 610 and then the bond ground strap is placed over the device ground pads and tote package pound 615. Depending upon the type of package, these may be bonding pads or a ground ring that surrounds the device die, as in the case of FIG. 3. In addition, multiple ground straps (referring back to FIG. 2E) may be used in a device/package configuration. After bonding the ground strap the device signal pads in the vicinity of ground strap may be wire bonded to the corresponding package landings 620. After the ground arch is bonded, the package is sealed 625.

Although the present invention is eminently suitable for a BGA package, it may be applied to any package having areas upon which the ground arch may be attached.

In addition, more than one ground arch may be used. In an example embodiment, the ground arch may be built in a first direction. The package/die assembly is rotated 90°, and another ground arch is attached.

In another example embodiment, the ground arch may be built with a combination of one ground arch being attached about the center of the device die and a second ground arch, without a center of die bond, is attached after the package/die assembly is rotated 90°.

More than two ground arches may be used to provide enhanced bond wire impedance. The designer would determine the number of ground arches required to achieve the desired control of impedance. The number of ground arches would be a function of the die size, package, number of wire bonds, etc.

In yet another example embodiment, a number of wire bonds may be woven together to make a mesh over the signal wire bonds and the device die. The mesh would be bonded to a ground location to provide shielding.

In another example embodiment, a half-arch that only connects to the package ground and extends over the wire bonds to provide shielding but does not contact the device, may be built. In a variation of this embodiment, the half arch may be designed to only contact the die, providing a reduction in the thermal resistance but not electrically coupling to the package.

While the present invention has been described with reference to several particular example embodiments, those skilled in the art will recognize that many changes may be made thereto without departing from the spirit and scope of the present invention, which is set forth in the following claims.

What is claimed is:

1. A method for controlling impedance of bond wires in packaging a semiconductor device die in a package, the method comprising:
defining locations of signal and power/ground pads on the device die; defining grounding trace locations on the package; bonding the signal pads and power/ground pads of the device die; providing a conductive path including a ground arch over the bond wires and grounding trace locations, rotating the package a pre-determined amount and providing an additional ground arch; and encapsulating the device die and the ground arch and additional ground arch.

2. The method of claim 1 wherein the pre-determined rotation amount is about 90 degrees.

3. The method of claim 1, wherein providing an additional ground arch is a function of device design, package size, number of wire bonds, and a desired impedance.

4. The method of claim 3, wherein the desired impedance is function of a ground arch distance from a wire bond.

* * * * *